(12) United States Patent
Mueller et al.

(10) Patent No.: US 11,056,356 B1
(45) Date of Patent: Jul. 6, 2021

(54) FLUID VISCOSITY CONTROL DURING WAFER BONDING

(71) Applicant: Intel Corporation, Santa Clara, CA (US)

(72) Inventors: Brennen K. Mueller, Portland, OR (US); Daniel Pantuso, Portland, OR (US); Mauro J. Kobrinsky, Portland, OR (US); Chytra Pawashe, Beaverton, OR (US); Myra McDonnell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 295 days.

(21) Appl. No.: 16/112,440

(22) Filed: Aug. 24, 2018

Related U.S. Application Data

(60) Provisional application No. 62/553,748, filed on Sep. 1, 2017.

(51) Int. Cl.
*B29C 65/00* (2006.01)
*H01L 21/67* (2006.01)
(Continued)

(52) U.S. Cl.
CPC ........ *H01L 21/67017* (2013.01); *H01L 21/50* (2013.01); *H01L 21/67092* (2013.01); *H01L 21/67098* (2013.01); *H01L 21/67248* (2013.01); *H01L 21/67276* (2013.01); *H01L 21/67389* (2013.01); *B29C 65/02* (2013.01); *B29C 65/7802* (2013.01); *B29C 65/782* (2013.01); *B29C 66/0014* (2013.01);
(Continued)

(58) Field of Classification Search
CPC ... B29C 65/02; B29C 65/7802; B29C 65/782; B29C 66/0014; B29C 66/0016; B29C 66/342; B29C 66/345; B29C 66/41
See application file for complete search history.

(56) References Cited

U.S. PATENT DOCUMENTS

| 5,769,991 | A | * | 6/1998 | Miyazawa | .......... | H01L 21/2007 156/153 |
| 7,595,545 | B2 | * | 9/2009 | Sueyoshi | ................ | B81C 3/001 156/349 |

(Continued)

FOREIGN PATENT DOCUMENTS

WO WO-2017140348 A1 * 8/2017 ............. H01L 25/50

*Primary Examiner* — Mark A Osele
*Assistant Examiner* — Nickolas R Harm
(74) *Attorney, Agent, or Firm* — Green, Howard & Mughal LLP

(57) ABSTRACT

Techniques and mechanisms for bonding a first wafer to a second wafer in the presence of a fluid, the viscosity of which is greater than a viscosity of air at standard ambient temperature and pressure. In an embodiment, a first surface of the first wafer is brought into close proximity to a second surface of the second wafer. The fluid is provided between the first surface and the second surface when a first region of the first surface is made to contact a second region of the second surface to form a bond. The viscosity of the fluid mitigates a rate of propagation of the bond along a wafer surface, which in turn mitigates wafer deformation and/or stress between wafers. In another embodiment, the viscosity of the fluid is changed dynamically while the bond propagates between the first surface and the second surface.

9 Claims, 11 Drawing Sheets

(51) Int. Cl.
 H01L 21/50 (2006.01)
 H01L 21/673 (2006.01)
 H01L 21/603 (2006.01)
 B29C 65/02 (2006.01)
 B29C 65/78 (2006.01)

(52) U.S. Cl.
 CPC ........ *B29C 66/0016* (2013.01); *B29C 66/342* (2013.01); *B29C 66/345* (2013.01); *B29C 66/41* (2013.01); *B29C 66/96* (2013.01); *H01L 2021/603* (2013.01)

(56) References Cited

U.S. PATENT DOCUMENTS

| | | | | |
|---|---|---|---|---|
| 7,682,933 B1* | 3/2010 | Loomis | | H01L 25/50 |
| | | | | 438/457 |
| 7,866,364 B2* | 1/2011 | Chen | | H01L 21/67092 |
| | | | | 156/581 |
| 8,151,852 B2* | 4/2012 | Zuniga | | H01L 21/67748 |
| | | | | 156/382 |
| 8,748,885 B2* | 6/2014 | Yeh | | H01L 21/67092 |
| | | | | 257/43 |
| 8,822,307 B2* | 9/2014 | Yamaguchi | | H01L 21/67092 |
| | | | | 438/455 |
| 8,999,090 B2* | 4/2015 | Gaudin | | H01L 21/67092 |
| | | | | 156/82 |
| 9,490,158 B2* | 11/2016 | Huang | | H01L 21/67092 |
| 9,576,827 B2* | 2/2017 | Liu | | B23B 31/307 |
| 10,410,892 B2* | 9/2019 | Lu | | H01L 23/544 |
| 10,639,875 B2* | 5/2020 | Kim | | H01L 21/67092 |
| 2007/0287264 A1* | 12/2007 | Rogers | | H01L 21/187 |
| | | | | 438/457 |
| 2009/0197053 A1* | 8/2009 | Sokolov | | B32B 37/003 |
| | | | | 428/195.1 |
| 2011/0217795 A1* | 9/2011 | Tanida | | B23P 19/00 |
| | | | | 438/16 |
| 2012/0006463 A1* | 1/2012 | Gaudin | | H01L 25/50 |
| | | | | 156/64 |
| 2012/0077329 A1* | 3/2012 | Broekaart | | H01L 24/80 |
| | | | | 438/455 |
| 2012/0088350 A1* | 4/2012 | Kerdiles | | H01L 21/02 |
| | | | | 438/455 |
| 2012/0193009 A1* | 8/2012 | Fujii | | H01L 21/67092 |
| | | | | 156/60 |
| 2015/0044786 A1* | 2/2015 | Huang | | H01L 21/681 |
| | | | | 438/14 |
| 2015/0318260 A1* | 11/2015 | Lin | | B23K 20/02 |
| | | | | 438/455 |
| 2016/0155721 A1* | 6/2016 | Sugakawa | | H01L 21/67248 |
| | | | | 438/5 |
| 2018/0076037 A1* | 3/2018 | Kurz | | H01L 21/2007 |
| 2018/0158796 A1* | 6/2018 | Otsuka | | H01L 21/67742 |

\* cited by examiner

FLUID VISCOSITY CONTROL DURING WAFER BONDING

CROSS REFERENCE TO RELATED APPLICATIONS

This non-provisional patent application is related to, and claims priority to, the provisional application entitled "FLUID VISCOSITY CONTROL DURING WAFER BONDING," filed Sep. 1, 2017, having an application Ser. No. 62/553,748, the entire contents of which are incorporated herein by reference.

BACKGROUND

1. Technical Field

Embodiments of the invention generally relate to wafer to wafer bonding and more particularly, but not exclusively, relate to wafer to wafer bonding in conditions which include a controlled fluid viscosity.

2. Background Art

In current wafer to wafer bonding, two wafers may be brought into close proximity to one another (e.g., with surfaces thereof about 30 to a few hundred microns apart) and bonding may be initiated by locally deforming one of the wafers to make local contact between the wafers. The wafers then bond to one another via propagation of the local contact to full bonding of the wafers. Such techniques provide undesirable distortions in one or both of the wafers and/or undesirable stress between the wafers.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
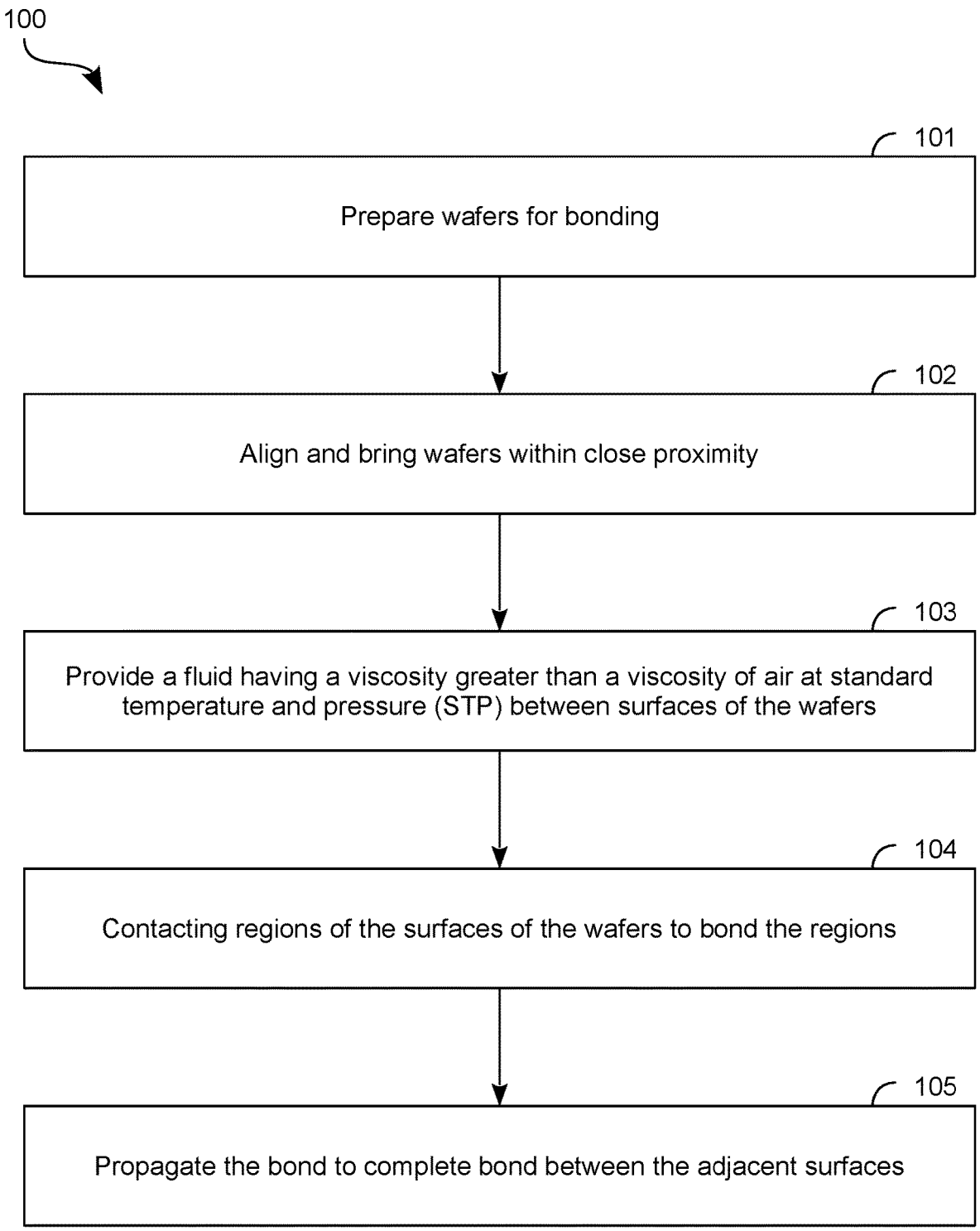
FIG. 1 is a flow diagram illustrating elements of a method for bonding wafers according to an embodiment.

Wafer to wafer bonding techniques and systems for performing such techniques are described below. Various embodiments include wafer to wafer bonding in the presence of a fluid, the viscosity of which is controlled to mitigate a rate at which a bond propagates along a wafer surface. Such a mitigated bonding rate may contribute to a mitigation of wafer distortion.

As is discussed further below, in some embodiments, a method for bonding wafers includes bringing a first surface of a first wafer within close proximity of a second surface of a second wafer, providing a fluid between the first surface and the second surface such that the fluid has a viscosity greater than a viscosity of air at standard ambient temperature and pressure, contacting a first region of the first surface to a second region of the second surface to form a bond therebetween, and propagating the bond to bond the first surface to the second surface. The wafers may be any suitable size and may include any suitable material or materials such as silicon or the like. In an embodiment, one or both of the wafers are glass wafers. As described, during the contacting of the wafer regions to bond the regions and during the propagation of the bonding across the surfaces, a fluid having a viscosity greater than a viscosity of air at standard ambient temperature and pressure (or "at SATP") is provided between the surfaces (i.e., between the surfaces while they are held apart and between the surfaces that are not yet bonded during bonding). The fluid may be introduced before the wafers are brought into proximity and/or brought into contact with each other. Alternatively, the fluid may be introduced after the formation of a bond has been initiated. The fluid may be any suitable fluid at any suitable temperature and pressure such that, as discussed, the fluid has a viscosity greater than a viscosity of air at standard ambient temperature and pressure. In some embodiments, the fluid is a gas. In some embodiments, the fluid is a liquid. Due to the fluid having an increased viscosity, the propagation of the bonding between the surfaces is slowed. Such slowing reduces distortion between the surfaces and the wafers and/or the stress between the wafers.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The technologies described herein may be implemented at least in part using one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including circuitry operable to control wafer bonding processes.

FIG. 1 shows features of a process 100 to bond two wafers in the presence of a fluid according to an embodiment. Process 100 begins at operation 101, where wafers are prepared for bonding. The wafers may include any suitable material or materials, substrates, device layers, metallization layers or the like. In an embodiment, one wafer is a device wafer (i.e., having devices formed on a surface thereof) and the other wafer is a carrier wafer. For example, one or both wafers may be or include monocrystalline silicon (Si), germanium (Ge), silicon germanium (SiGe), a III-V materials-based material (e.g., gallium arsenide (GaAs)), a silicon carbide (SiC), a sapphire ($Al_2O_3$), glass, or any combination thereof. In various examples, one or both wafers may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like. The wafers may be prepared for bonding using any suitable technique or techniques. In an embodiment, one or both wafers are polished (i.e., the surfaces to be bonded are polished) prior to bonding. In an embodiment, the wafer surfaces to be bonded are deposited with silicon oxide layers and planarized using, for example, a chemical-mechanical polishing technique. In an embodiment, preparation for bonding includes chemical and physical surface treatment of bonding materials. The wafer surfaces to be bonded may include any suitable material or materials. In an embodiment, one of the wafers to be bonded is a carrier wafer comprising a glass substrate.

Process 100 continues at operation 102, where the wafers are aligned and their surfaces are brought within close proximity. To illustrate certain features of various embodiments, one example of process 100 is described herein with reference to structures which are variously illustrated in FIGS. 2A-2D. However, such description may be extended to apply to any of various additional or alternative structures, according to other embodiments.

Figure 2A:
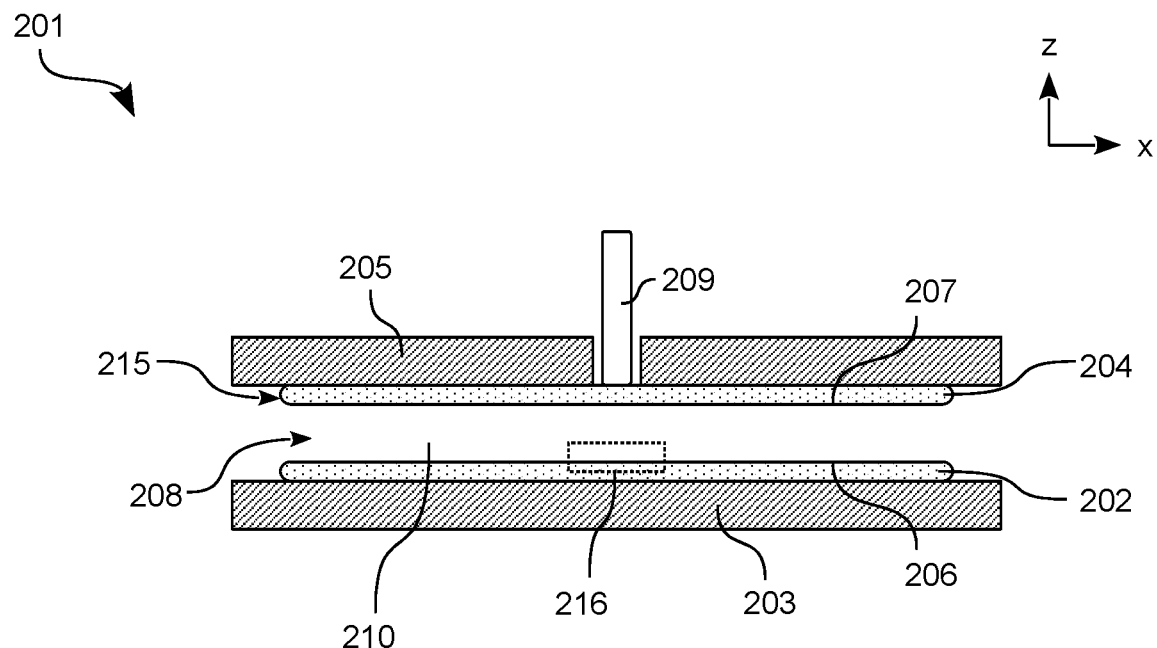
FIGS. 2A-2D are side view diagrams each illustrating a respective stage of a process to bond wafers according to an embodiment.

FIG. 2A illustrates a work piece arrangement 201 after the wafers are prepared for bonding and brought within close proximity of one another, arranged in accordance with at least some implementations of the present disclosure. The wafers may be brought into close proximity of one another using any suitable technique or techniques.

As shown in FIG. 2A, a wafer 202 is secured to and/or handled by a wafer holder 203 and a wafer 204 is secured to and/or handled by a wafer holder 205 such that a surface 206 of wafer 202 is within close proximity of a surface 207 of wafer 204. For example, surface 206 and surface 207 may have a gap 208 therebetween of about 30-150 microns (i.e., a distance in the z-direction). Also as shown in FIG. 2A, a wafer deformer 209 is provided such that wafer deformer 209 may protrude from wafer holder 205 to deform wafer 204 as discussed below. In the illustrated embodiment, a physical pin is used as the wafer deformer. In other embodiments, the wafer can be deformed by applying pressure to the wafer or using a chuck of wafer holder 205 (i.e., by using a deformed chuck or by deforming the chuck).

Wafer holders 203, 205 may be any suitable wafer holders such as chucks or the like. In an embodiment, wafer holders 203, 205 are vacuum chucks. In an embodiment, wafer 204 is loaded and aligned onto wafer holder 205 and wafer 204 is held in an aligned position on a face of wafer holder 205 by a vacuum applied to vacuum channels therein. Similarly, wafer 202 may be loaded and aligned onto wafer holder 203 and wafer 202 may be held in an aligned position on the face of wafer holder 203 by a vacuum applied to vacuum channels therein. In other embodiments, wafer 202 is held by wafer holder 203 by electrostatic force, a clamp, or the like. Furthermore, in some embodiments, wafer 204 may be held within close proximity by pins, support structures around the edges of wafer 204, or the like.

Returning to FIG. 1, processing continues at operation 103, where a fluid is provided between the surfaces of the wafers such that the fluid has a viscosity greater than the viscosity of air (i.e., clean dry air, or "CDA") at standard ambient temperature and pressure (IUPAC SATP), which is at or about $1.8 \times 10^{-5}$ Pa·s. In some embodiments, particularly in embodiments where the fluid is a liquid, operations 103 and 102 may be performed in the opposite order (i.e., with the fluid being provided before the wafers are brought into close proximity with one another).

With reference to FIG. 2A, a fluid 210 is provided between surfaces 206, 207. In some embodiments, fluid 210 is a gas. In some embodiments, fluid 210 is a liquid. In the illustrated embodiment, fluid 210 is provided within the entirety of gap 208, which is the case in embodiments where fluid 210 is a gas. In embodiments where fluid 210 is a liquid, the liquid may be provided within the entirety of gap 208 or only within a portion of gap 208 as shown with respect to region 216. For example, only a small puddle or droplet or droplets or the like of a liquid may be provided within region 216 on surface 206 of wafer 202. The liquid may contact only surface 206 within region 216 or it may contact both surface 206 and surface 207.

As is discussed elsewhere herein, by providing fluid 210 having a viscosity greater than air at standard ambient temperature and pressure, the propagation of bonding between wafers 202, 204 is slowed (relative to propagation of bonding using a fluid with the viscosity of air at standard ambient temperature and pressure). By slowing the propagation of bonding, the distortion of each of wafers 202, 204 and/or the stress between wafers 202, 204 is advantageously reduced. Such reduction of distortion may provide for improved patterning on a back side surface of wafer 202 (i.e., the surface of wafer 202 opposite surface 206) or improved patterning on a back side surface of wafer 204 (i.e., the surface of wafer 204 opposite surface 207). Similarly, such reduction in stress between wafers 202, 204 may reduce the warping or distortion of one of wafers 202, 204 when the wafer is optionally thinned, which, again may cause difficulties in patterning on the back side after the thinning and distortion of the thinned wafer as it strains under the stress caused by the bonding of wafers 202, 204. Reduction of distortion may also be advantageous in the case of bonding two patterned wafers (i.e., pattern-to-pattern bonding). In such examples, if one or both wafers are distorted, then the patterns will no longer align.

Fluid 210 may include any suitable gas(es) or liquid(s). As discussed, in some embodiments, fluid 210 is a gas. In an embodiment, fluid 210 is air such as clean dry air (CDA) that has been pressurized and/or heated to increase its viscosity to a point greater than that of CDA at standard ambient temperature (25° C.) and standard ambient pressure (1 atm).

Figure 3:
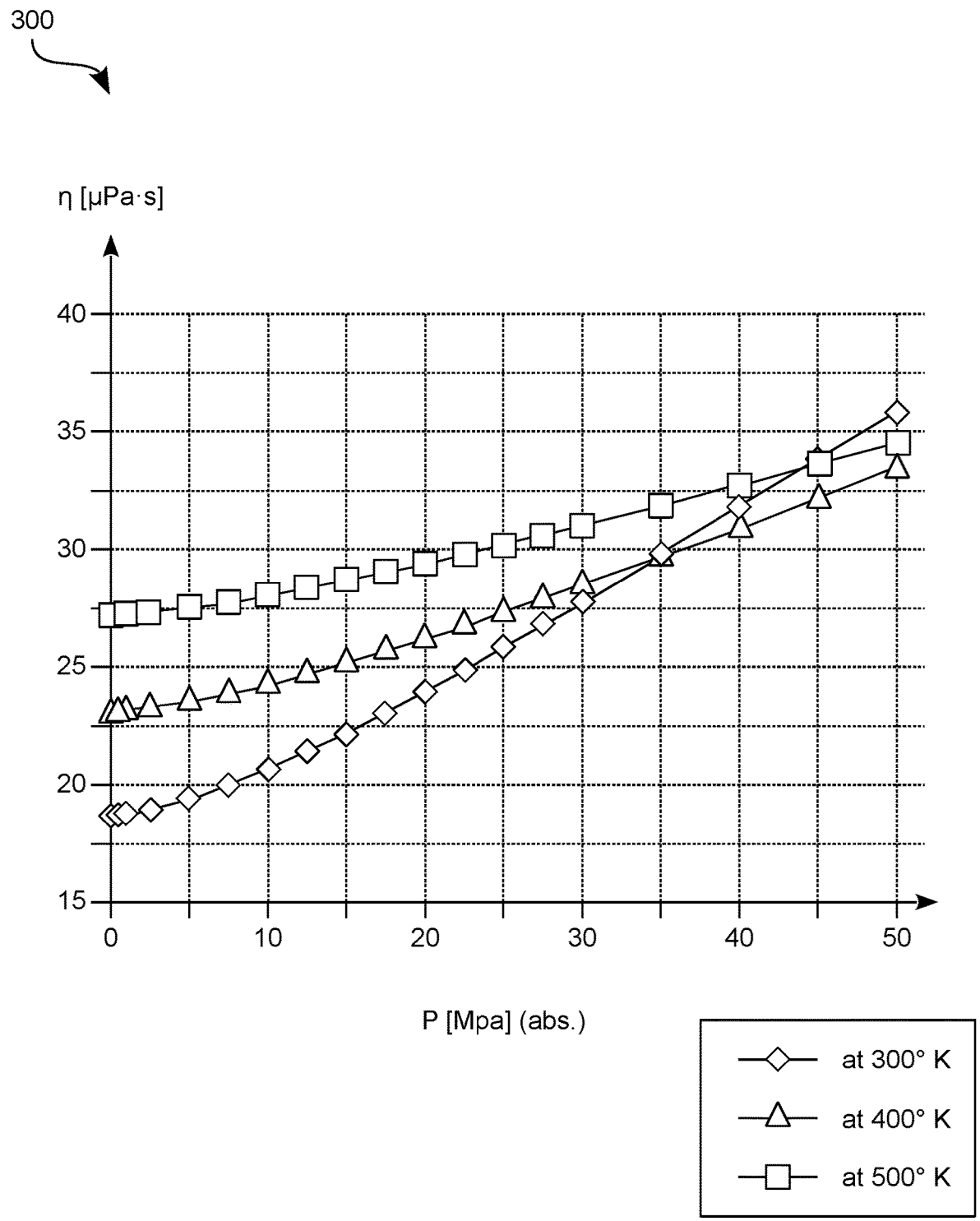
FIG. 3 is a chart illustrating an example of viscosity characteristics for a fluid used in processing to bond wafers according to an embodiment.

FIG. 3 illustrates an example chart of dynamic viscosity (TO) of dry air versus pressure (P) at different isotherms, arranged in accordance with at least some implementations of the present disclosure.

In some embodiments, fluid 210 is CDA at ambient temperature (i.e., 20-28° C.) at not less than 2 atm and an elevated pressure. In an embodiment, fluid 210 is CDA at ambient temperature (i.e., 20-28° C.) at not less than 2 atm. In an embodiment, fluid 210 is CDA at ambient temperature (i.e., 20-28° C.) at a pressure in the range of 2 to 3 atm. In an embodiment, fluid 210 is CDA at ambient temperature (i.e., 20-28° C.) at not less than 3 atm. In an embodiment, fluid 210 is CDA at ambient temperature (i.e., 20-28° C.) at a pressure in the range of 3 to 5 atm. In an embodiment, fluid 210 is CDA at ambient temperature (i.e., 20-28° C.) at not less than 5 atm. As shown in FIG. 3 with respect to the isotherm at 300° K (i.e., 26.85° C.), increasing pressure increases the viscosity of CDA.

In some embodiments, fluid 210 is CDA at ambient pressure (i.e., about 1 atm) and an elevated temperature. As shown in FIG. 3 increasing temperature may more efficiently increase the viscosity of CDA. In an embodiment, fluid 210 is CDA at ambient pressure (i.e., about 1 atm) and a temperature of not less than 50° C. In an embodiment, fluid 210 is CDA at ambient pressure (i.e., about 1 atm) and a temperature in the range of 50 to 100° C. In an embodiment, fluid 210 is CDA at ambient pressure (i.e., about 1 atm) and a temperature of not less than 100° C. In an embodiment, fluid 210 is CDA at ambient pressure (i.e., about 1 atm) and a temperature in the range of 100 to 200° C. In an embodiment, fluid 210 is CDA at ambient pressure (i.e., about 1 atm) and a temperature of not less than 150° C. In an embodiment, fluid 210 is CDA at ambient pressure (i.e., about 1 atm) and a temperature of not less than 200° C. As shown in FIG. 3 with respect to the isotherms at 300° K, 400° K, and 500° K (i.e., 26.85° C., 126.85° C., and 226.85° C., respectively), increasing temperature increases the viscosity of CDA.

In some embodiments, fluid 210 is CDA at both an elevated pressure and an elevated temperature with respect to SATP. In an embodiment, fluid 210 is CDA at a pressure of not less than 2 atm and a temperature of not less than 50° C. In an embodiment, fluid 210 is CDA at a pressure in the range of 2 to 3 atm and a temperature of not less than 50° C. In an embodiment, fluid 210 is CDA at a pressure of not less than 3 atm and a temperature of not less than 50° C. In an embodiment, fluid 210 is CDA at a pressure of not less than 2 atm and a temperature of not less than 100° C. In an embodiment, fluid 210 is CDA at a pressure of not less than 2 atm and a temperature in the range of 50 to 100° C. In an embodiment, fluid 210 is CDA at a pressure of not less than 2 atm and a temperature in the range of 100 to 200° C. In an embodiment, fluid 210 is CDA at a pressure of not less than 2 atm and a temperature in the range of 200° C.

As discussed fluid 210 may be any suitable temperature. In an embodiment, fluid 210 is argon. In an embodiment, fluid 210 is argon (e.g., fluid 210 is not less than 99% argon), which has a viscosity at SATP of about $2.23 \times 10^{-5}$ Pa·s. In an embodiment, fluid 210 is helium (e.g., fluid 210 is not less than 99% helium), which has a viscosity at SATP of about $1.96 \times 10^{-5}$ Pa·s. In an embodiment, fluid 210 is neon (e.g., fluid 210 is not less than 99% neon), which has a viscosity at SATP of about $3.13 \times 10^{-5}$ Pa·s. In an embodiment, fluid 210 is oxygen (e.g., fluid 210 is not less than 99% oxygen), which has a viscosity at SATP of about $2.04 \times 10^{-5}$ Pa·s. In an embodiment, fluid 210 is xenon (e.g., fluid 210 is not less than 99% xenon), which has a viscosity at SATP of about $2.28 \times 10^{-5}$ Pa·s. In such embodiments, fluid 210 may be provided at SATP or at any suitable elevated temperature and/or pressure such as those discussed with respect to CDA, which will not be repeated for the sake of brevity. Furthermore, fluid 210 may include any combination of such gases.

In other embodiments, fluid 210 is a liquid. Fluid 210 may be any suitable liquid. In an embodiment, fluid 210 is water (e.g., fluid 210 is not less than 99% pure water). In an embodiment, fluid 210 is isopropyl alcohol (e.g., fluid 210 is not less than 99% isopropyl alcohol). In an embodiment, fluid 210 is acetone (e.g., fluid 210 is not less than 99% acetone). In an embodiment, fluid 210 is acetone (e.g., fluid 210 is not less than 99% acetone). Furthermore, fluid 210 may include any combination of such liquids.

Returning to FIG. 1, processing continues at operation 104, where regions of the wafers are contacted to bond the regions. For example, bonding small regions of the wafers (e.g., at a center of the wafers) may begin a bonding that will propagate a bond between the wafers radially out from the initially contacted center regions. In other embodiments, the relatively small regions of wafer brought into contact are at or near an edge of the wafers. In some embodiments, operations 103 and 104 may be performed in the opposite order (i.e., with the fluid being provided after the formation of a bond has been initiated by the contact).

Figure 2B:
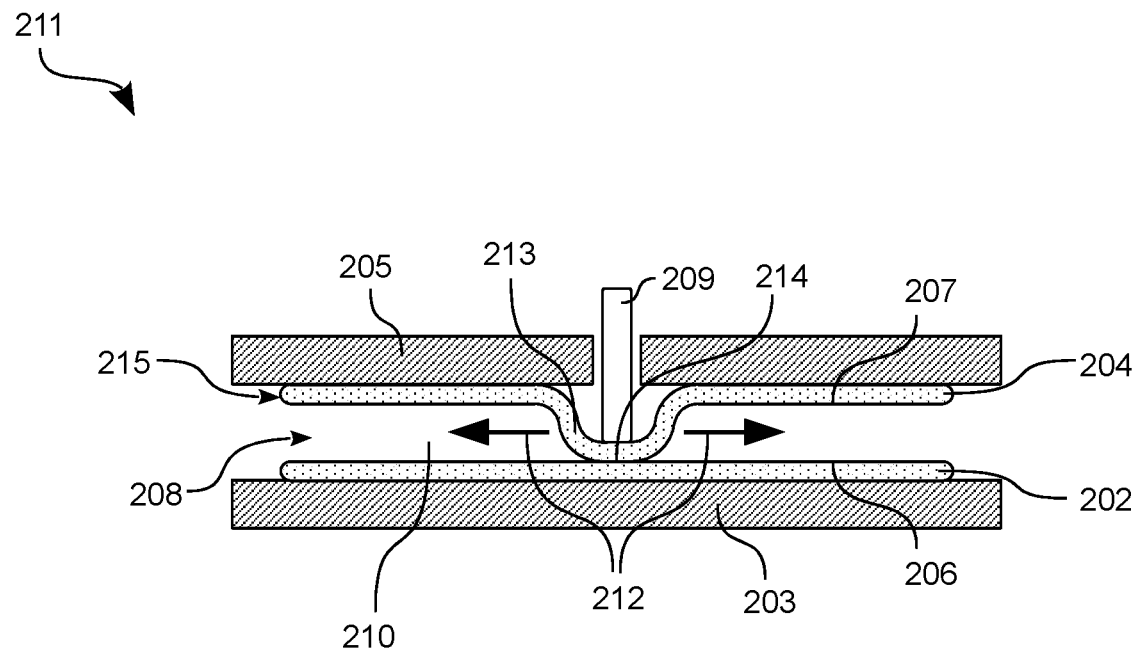

For example, FIG. 2B illustrates a work piece arrangement 211 similar to work piece arrangement 201 after wafer deformer 209 has deformed a portion 213 of wafer 204 to bring a region of wafer 204 into contact with a region of wafer 202 at contact region 214, arranged in accordance with at least some implementations of the present disclosure. The degree and shape of wafer deformation at portion 213 is merely illustrative, and not limiting on some embodiments. Wafer deformer 209 may include any suitable wafer deformer such as a pin or peg, as illustrated, a roller, or the like and wafer deformer 209 may deform wafer 204 using any suitable technique or techniques. In an embodiment, wafer deformer 209 deforms wafer 204 such that contact region 214 is at or about at center of wafer 202 and wafer 204.

As shown in FIG. 2B with respect to arrows 212, fluid 210 is moved out and away from contact region 214. As discussed, by providing fluid 210 having an increased viscosity with respect to CDA at SATP, propagation of the bonding of surface 206 to surface 207 is slowed such that the distortion of wafers 202, 204 and/or the stress between wafers 202, 204 is reduced. As discussed, fluid 210 may be a gas or a liquid.

Returning to FIG. 1, processing continues at operation 105, where the bond initiated between regions of the wafers is propagated to complete the bond between surface 206 of wafer 202 and surface 207 of wafer 204. Since surfaces 206, 207 were brought into close proximity and the bond was initiated at the discussed local region (e.g., via a "point" contact), the bond may propagate outwardly (e.g., in the x-y directions) from the centers of wafers 202, 204 to complete the bond therebetween. For example after initial contact, the wafers may bond together under the attraction therebetween.

Figure 2C:
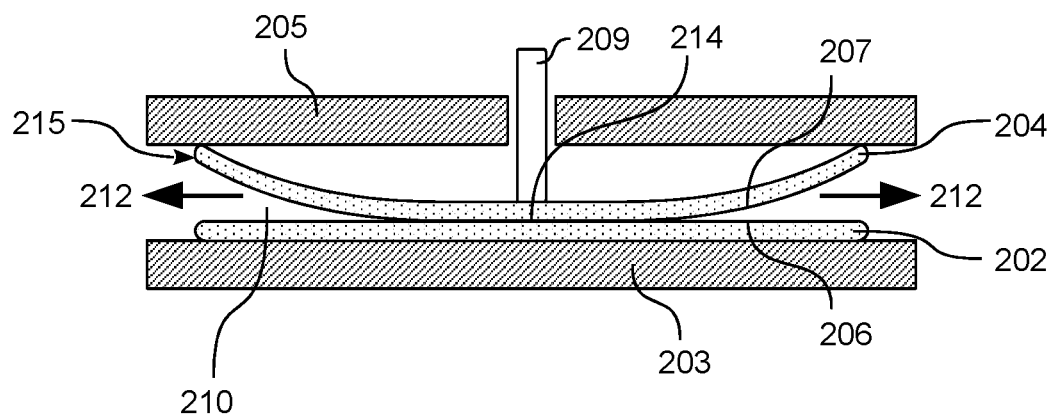

By way of illustration and not limitation, FIG. 2C illustrates a first example work piece arrangement 221 similar to work piece arrangement 211 as bonding between wafers 202, 204 propagates, arranged in accordance with at least some implementations of the present disclosure. The bonding between wafers 202, 204 may propagate due to attractive forces between surfaces 206, 207 for example.

As shown in FIG. 2C, contact region 214 increases in size as the bond between surfaces 206, 207 propagates to complete the bond therebetween. Furthermore, as shown with respect to arrows 212, fluid 210 is moved out and away from contact region 214 as the bond propagates. As discussed, by providing fluid 210 having an increased viscosity with respect to CDA at SATP, propagation of the bonding of surface 206 to surface 207 is slowed such that the distortion of wafers 202, 204 and/or the stress between wafers 202, 204 is reduced. As discussed, fluid 210 may be a gas or a liquid.

Figure 2D:
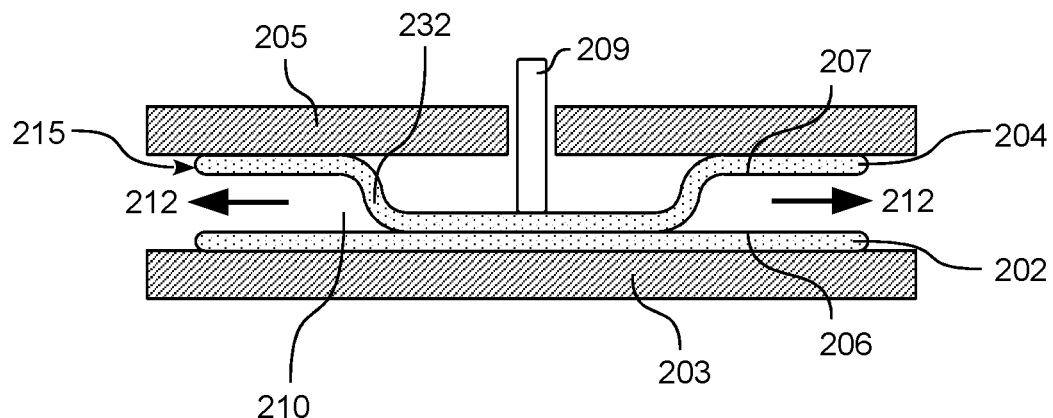

FIG. 2D illustrates a second example work piece arrangement 231 similar to work piece arrangement 211 as bonding between wafers 202, 204 propagates, arranged in accordance with at least some implementations of the present disclosure. The bonding between wafers 202, 204 may propagate due to attractive forces between surfaces 206, 207 for example.

As shown in FIG. 2D, contact region 214 increases in size as the bond between surfaces 206, 207 propagates to complete the bond therebetween. Furthermore, as shown with respect to arrows 212, fluid 210 is moved out and away from contact region 214 as the bond propagates. As discussed, by providing fluid 210 having an increased viscosity with respect to CDA at SATP, propagation of the bonding of surface 206 to surface 207 is slowed such that the distortion of wafers 202, 204 and/or the stress between wafers 202, 204 is reduced. As discussed, fluid 210 may be a gas or a liquid. For example, FIG. 2D may illustrate an example deformation 232 that may propagate outwardly during the propagation of bonding or contact between surfaces 206, 207. As discussed, deformation 232 (e.g., a bond front between wafers 202, 204) is advantageously slowed during propagation of the bonding or contact between surfaces 206, 207. Such slowing of bonding provides closer to ideal bonding between wafers 202, 204.

Figure 2E:
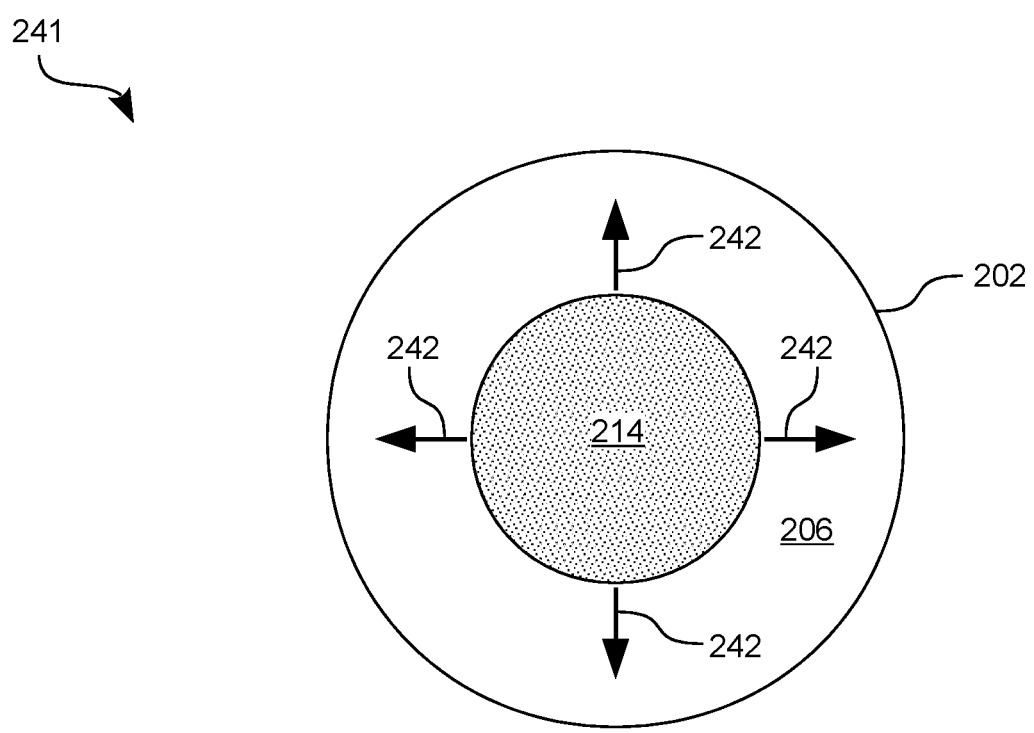
FIG. 2E is a cross-sectional top view diagram illustrating a stage of a process to bond wafers according to an embodiment.

FIG. 2E illustrates a cross sectional view in the negative z-direction of example radial bonding propagation 241, arranged in accordance with at least some implementations of the present disclosure. As discussed, the bonding between wafers 202, 204 may propagate due to attractive forces between surfaces 206, 207 for example.

As shown in FIG. 2E, contact region 214 increases in size substantially along radial directions 242 as the bond between surface 206 and surface 207 (not shown in FIG. 2E) propagates to complete the bond therebetween.

As will be appreciated the bonding illustrated in FIGS. 2C and 2D may continue to propagate until surfaces 206, 207 are fully or substantially fully bonded. After bonding, wafers 202, 204 may be further processed using any suitable technique or techniques such as back side grinding or etch, back side patterning of devices, metallization or interconnect layers, or the like. In an embodiment, devices formed on or within surface 206 of wafer 202 may be contacted (e.g., electrically contacted) using such back side processing techniques. In an embodiment, devices formed on or within surface 207 of wafer 204 may be contacted (e.g., electrically contacted) using such back side processing techniques.

In some embodiments, process 100 may provide a static control of fluid viscosity during bonding. For example, the composition of fluid 210 may be preselected, fluid 210 may be provided at a particular temperature and pressure, and the fluid type, temperature and pressure may remain substantially constant during the described processing. Such processing may require fluid 210 to be flowed (e.g., in gas embodiments) during processing, however, such processing may still be characterized as static as the fluid type, temperature and pressure may remain substantially constant as discussed.

In other embodiments, dynamic control of fluid viscosity during bonding may be provided such that one or more of the fluid type, temperature and pressure are varied during the bonding process.

Figure 4:
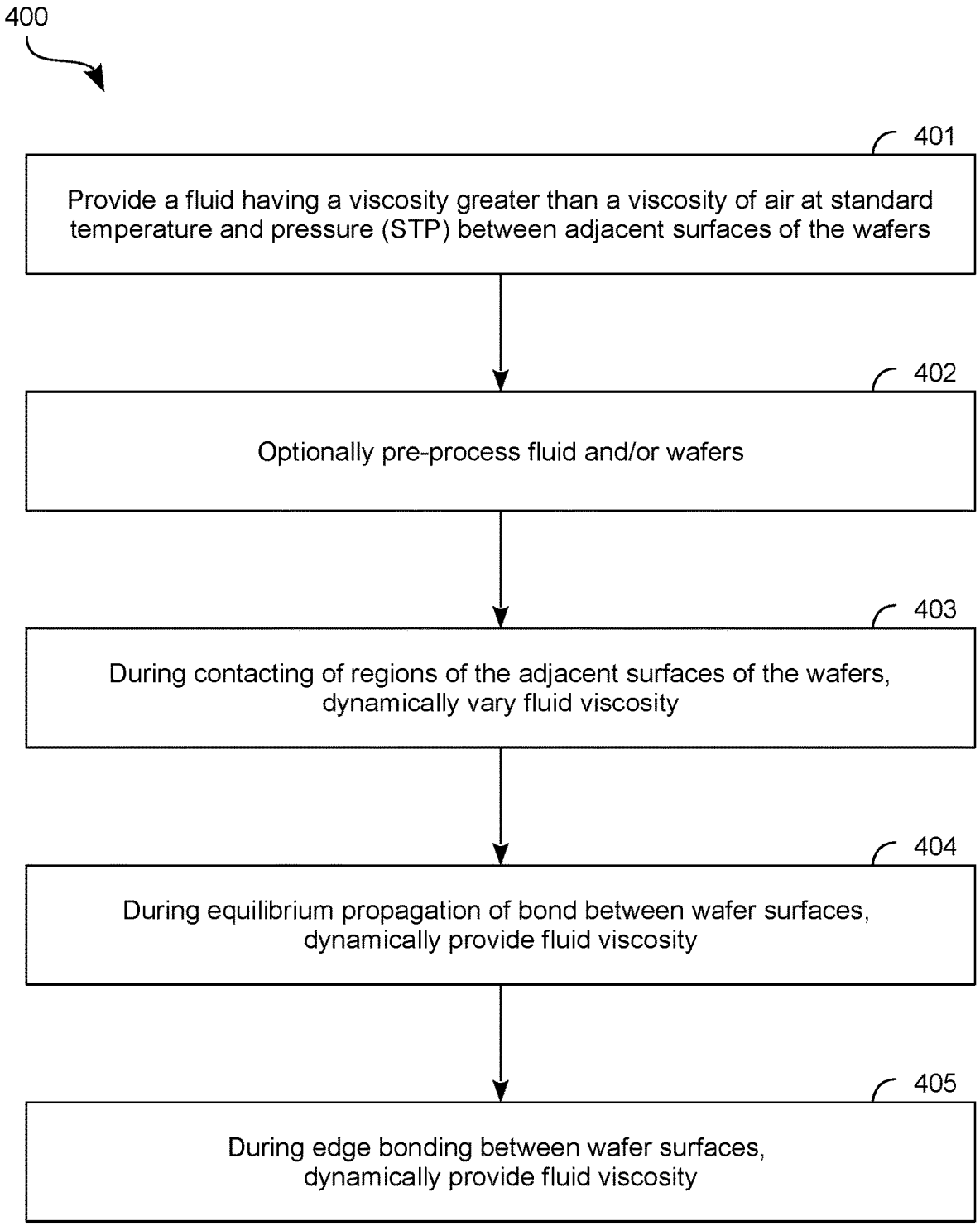
FIG. 4 is a flow diagram illustrating elements of a method for bonding wafers according to an embodiment.

FIG. 4 is a flow diagram illustrating an exemplary process 400 for bonding wafers using controlled fluid viscosity, arranged in accordance with at least some implementations of the present disclosure. In the illustrated implementation, process 400 may include one or more operations as illustrated by operations 401-405. However, embodiments herein may include additional operations, certain operations being omitted, or operations being performed out of the order provided. In an embodiment, process 400 is preceded by operations 101, 102 as discussed with respect to process 100.

Process 400 begins or continues at operation 401, where a fluid is provided between the surfaces of the wafers such that the fluid has a viscosity greater than the viscosity of air (i.e., CDA) at standard ambient temperature and pressure (IUPAC SATP), which is at or about $1.8 \times 10^{-5}$ Pa·s. The fluid provided between the surfaces of the wafers may be any fluid as discussed herein.

As discussed herein, wafers may be brought into close proximity, contacted at a small region to begin a bond, and the bond may propagate radially across the wafers to complete the bond between the wafers. Such bonding may include three phases. In a first phase, one of the wafers is distorted (or deflected) to provide a local dish (e.g., distortion), as shown in FIG. 2B, such that a region of the distorted wafer is brought into contact with a region of the other wafer. The first phase thus initiates the bond between the wafers. In a second phase, the bond propagates at a substantially steady state or at equilibrium radially and outwardly across the wafers. The steady state or equilibrium propagation has a substantially steady velocity and is characterized in that there is a balance between the fluid being pushed out and the bond front propagation. In a third phase of the bonding, the fluid and bond front approach the (empty or exposed) edge region of the wafers such that the fluid rushes out and the rate of bonding increases such that the edges snap together.

Recognizing such phases of bonding between the wafers, dynamic fluid viscosity of fluid 210 may be provide during the discussed bonding. For example, local areas of fluid 210 may be heated to increase the viscosity at locations with respect to wafers 202, 204, temperature and/or pressure may be varied during bonding, the content of fluid 210 may be varied during bonding, or any combination thereof.

For example, during the first phase (initial contact) it may be advantageous for the fluid local to the contact to be higher in viscosity such that the deformation is reduced and/or such that the deformation eases into the equilibrium phase. Furthermore, during the third phase (edge contact), it may be advantageous to increase the viscosity of fluid 210 such that the edge snap effect is reduced.

Returning to FIG. 4, process 400 continues at operation 402, where the fluid and/or the wafers may be preprocessed using any suitable technique or techniques. For example, as discussed, it may be advantageous to provide higher viscosity fluid near the initial contact between the surfaces of the wafers. With reference to FIG. 2A, in an embodiment, the fluid near region 216 is heated (e.g., to 20-25° C. more than adjacent regions, to 25-50° C. more than adjacent regions, or more) prior to initiation of contact between the wafers. As will be appreciated, the heating of region 216 may dissipate relatively quickly. Therefore, region 216 may be heated using heating elements in one or both of wafer holders 203, 205 adjacent to region 216.

In addition or in the alternative, higher viscosity fluid may be provided during the final phase (edge contact) between the surfaces of the wafers. Again, with reference to FIG. 2A, in an embodiment, the fluid near the outer edges 215 of wafers, 202, 204 is heated (e.g., to 20-25° C. more than adjacent regions, to 25-50° C. more than adjacent regions, or more) prior to initiation of contact between the wafers. In an embodiment the fluid near outer edges 215 may be heated using heating elements in one or both of wafer holders 203, 205 adjacent to region 216. In an embodiment the fluid near outer edges 215 may be heated using heating elements in a chamber housing wafer holders 203, 205.

In an embodiment, after preprocessing operation 402, no additional variation is made during wafer bonding. That is, processing may continue as discussed with respect to operations 104 and 105 of process 100. Alternatively, after preprocessing operation 402, additional dynamic variations may be provided as discussed with respect to operations 403, 404.

Process 400 continues at operation 403, where during contacting of regions of the adjacent surfaces of the wafers, the fluid viscosity is dynamically varied. As discussed, in an embodiment, prior to contacting the regions of the surfaces of the wafers, fluid local to the contacting may be preheated to increase the viscosity thereof. In addition or in the alternative, during contact, the pressure of fluid 210 may be increased (i.e., to not less than 2 atm, not less than 3 atm, or more) during said contacting and then reduced during the equilibrium phase of bonding.

Process 400 continues at operation 404, where during equilibrium propagation of the bond between wafer surfaces, the fluid viscosity is dynamically varied. During equilibrium bonding it may be advantageous to have a reduced fluid viscosity with respect to the fluid viscosity during first contact between the regions (as discussed with respect to operation 403) and/or with respect to the fluid viscosity during edge bonding (as discussed with respect to operation 405). Therefore, during operation 404, the pressure of fluid 210 may be decreased (e.g., from an elevated pressure to 2 atm or 1 atm) during equilibrium propagation of the bond. In an embodiment, no heating is provided during equilibrium propagation of the bond. With reference to FIGS. 2C and 2D, in an embodiment, reduction of the viscosity of fluid 210 may be provided by flowing cooler fluid into a chamber housing wafers 202, 204. In an embodiment, reduction of the viscosity of fluid 210 may be provided by flowing a fluid having a lower viscosity (e.g., having a different composition than the initial fluid) into a chamber housing wafers 202, 204.

Process 400 continues at operation 405, where during edge bonding between the adjacent surfaces of the wafers, the fluid viscosity is dynamically varied. As discussed, in an embodiment, during edge bonding, fluid local to the contacting may be preheated to increase the viscosity thereof. In addition or in the alternative, during edge bonding, the pressure of fluid 210 may be increased (i.e., to not less than 2 atm, not less than 3 atm, or more) during the edge bonding. In an embodiment, a ring may be provided proximal to edges 215 (please see FIG. 2A) such that the ring seals with wafer holders 203, 205 to provide a complete or partial seal of wafers 202, 204. Such a complete or partial seal with a ring proximal (e.g., at about 100 microns to 1 cm from edges 215) may provide, as fluid 210 is dispelled, increasing pressure and therefore increasing viscosity of fluid 210 thus further slowing edge bonding.

Figure 5:
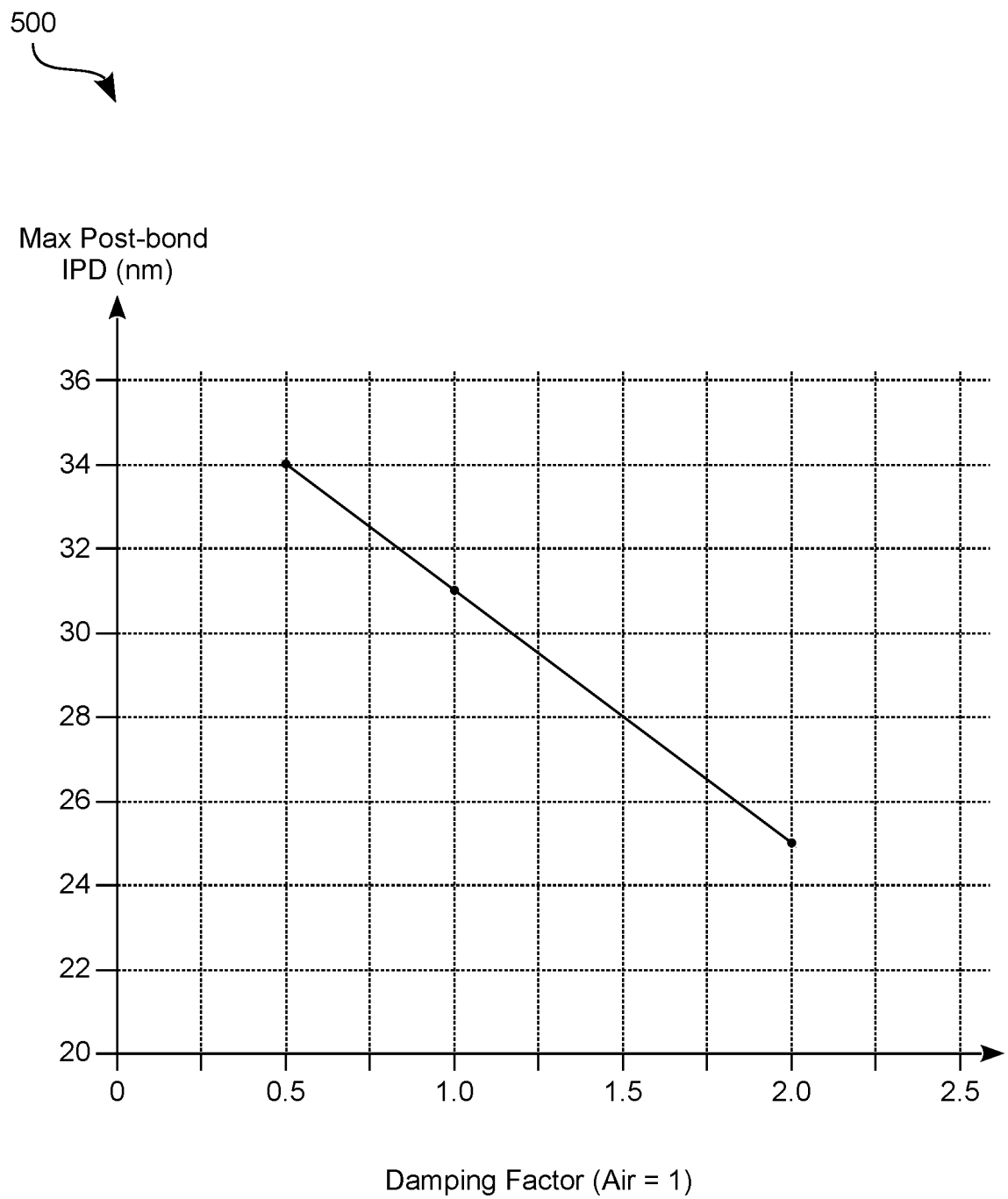
FIG. 5 is a chart illustrating an example of wafer distortion characteristics for processing, under various conditions, to bond wafers according to an embodiment.

FIG. 5 illustrates an example chart 500 of in-plane distortion (IPD) versus a damping factor, arranged in accordance with at least some implementations of the present disclosure. The illustrated damping factor is a factor that indicates how much damping (e.g., slowing of the propagation of bonding between wafers) is provided during bonding relative to a damping factor of 1 for CDA at SATP. For example, the damping factor may be increased by increasing the viscosity of the fluid between the wafers during bonding (either statically or dynamically) as discussed herein. As shown in FIG. 5, by increasing the damping factor, the maximum post bond in-plane distortion (e.g., in plane with surfaces of wafers 202, 204) may be reduced significantly.

Figure 6:
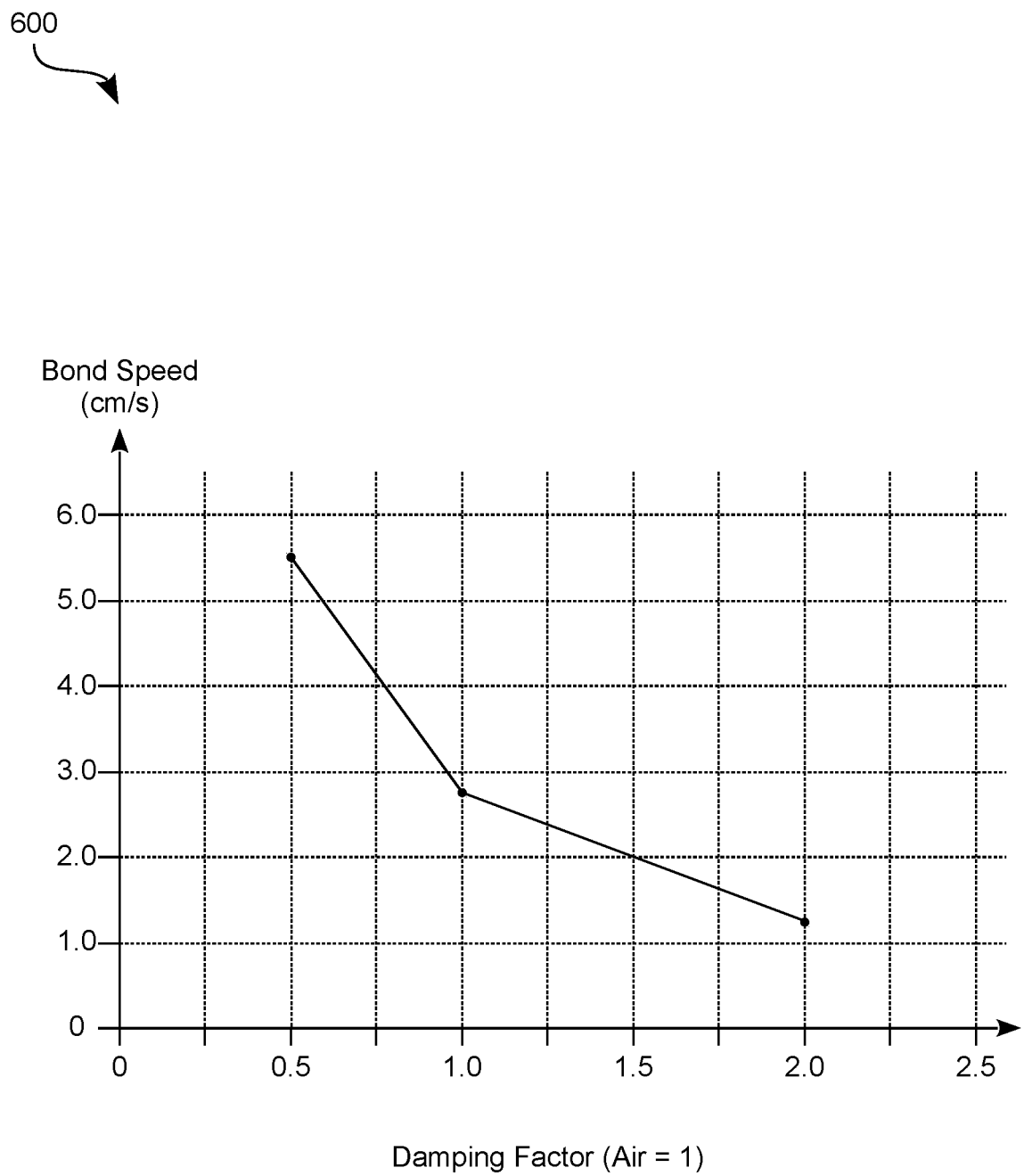
FIG. 6 is a chart illustrating an example of bond speed characteristics for processing, under various conditions, to bond wafers according to an embodiment.

FIG. 6 illustrates an example chart 600 of bond speed—i.e., a rate of propagation of a bond—versus a damping factor, arranged in accordance with at least some implementations of the present disclosure. As discussed with respect to FIG. 5, the damping factor is a factor that indicates how much damping is provided during bonding relative to a damping factor of 1 for CDA at SATP. For example, the damping factor may be increased by increasing the viscosity of the fluid between the wafers during bonding (either statically or dynamically) as discussed herein. As shown in FIG. 6, by increasing the damping factor, the bond speed is reduced significantly, which thereby causes decreased distortion as illustrated in FIG. 5 and/or decreased stress between bonded wafers 202, 204 as discussed herein.

As shown with respect to FIGS. 5 and 6, significantly reduced distortion of one or both of wafers 202, 204 and/or significantly reduced stress therebetween may be provided using the techniques discussed herein.

Figure 7:
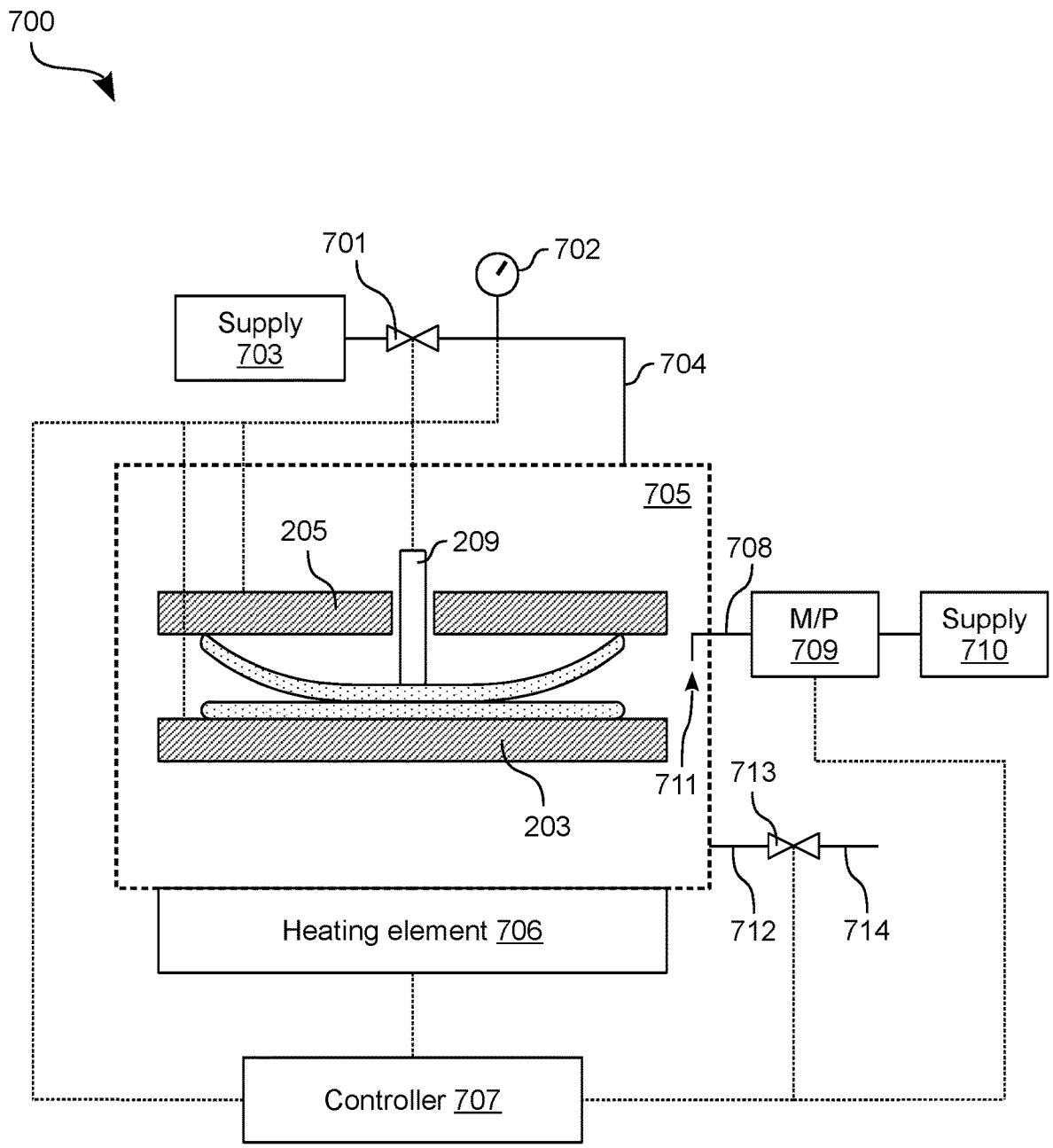
FIG. 7 is a functional block diagram illustrating elements of a system to bond wafers according to an embodiment.

FIG. 7 illustrates an example system 700 for bonding wafers using controlled fluid viscosity, arranged in accordance with at least some implementations of the present disclosure. As shown in FIG. 7, system 700 may include a valve 701, a pressure gauge 702, a gas supply 703, an inlet port 704, a chamber 705 (or housing), a heating element 706, a controller 707, a dispense arm 708 including a dispense nozzle 711, a dispense arm motor and pump 709, a liquid supply 710, an outlet port 712, a valve 713, and an exhaust line 714. Also as shown, system 700 may include wafer holders 203, 205 and wafer deformer 209 within chamber 705.

System 700 may, under the control of controller 707, perform any techniques discussed herein such as those discussed with respect to processes 100, 400. Any one or more of the operations of process 100, 400 (or any other operations discussed herein) may be undertaken in response to instructions provided by one or more computer program products as implemented by controller 707. Such program products may include signal bearing media providing instructions that, when executed by, for example, a processor, may provide the functionality described herein. The computer program products may be provided in any form of computer readable medium. Thus, for example, a processor including one or more processor core(s) may undertake one or more of the described operations in response to instructions conveyed to the processor by a computer readable medium. In an embodiment, controller 707 is implemented as a computing device (or portions thereof) as discussed with respect to FIG. 8.

As shown, system 700 may include a gas supply 703, which may include any container or bulk supply line of any fluid (e.g., fluid 210) as discussed herein. Gas supply from gas supply 703 may be pressurized and/or a pump may be provided between gas supply 703 and valve 701. Valve 701 may be any suitable valve such as a butterfly valve that may control flow and/or pressure of the gas supply, which may be monitored by pressure gauge 702. Pressure gauge 702 may be any suitable pressure gauge. In the illustrated embodiment, inlet port 704 is at a top of chamber 705. However, inlet port 704 may be at any suitable location of chamber 705. In an embodiment, inlet port 704 or multiple inlet ports are provided at or near the edges of wafer holders 203, 205 (and thereby the wafers being processed) such that greater pressure and viscosity are provided near the edges of the wafers to decrease bond speed or bond propagation speed during edge bonding as discussed herein.

System 700 may also include outlet port 712, which may provide for removal of gas from chamber 705 valve 713, which may be any suitable valve such as a butterfly valve, under the control of controller 707. In the illustrated embodiment, outlet port 712 is at a side of chamber 705. However, outlet port 712 may be at any suitable location of chamber 705. In an embodiment, outlet port 712 is provided at a top or bottom of chamber 705 such that greater pressure and viscosity are provided near the edges of the wafers (e.g., by not relieving pressure at an outlet port near the edges) to decrease bond speed or bond propagation speed during edge bonding as discussed herein.

System 700 may also include liquid supply 710, which may supply any liquid fluid discussed herein to a wafer being processed via dispense arm 708. For example, dispense arm 708 includes a tube or piping from liquid supply 710 to nozzle 711 and dispense arm 708 may be controlled by motor and pump 709 to dispense liquid onto the bottom wafer being processed.

System 700 may also include a heating element 706 to heat the fluid in chamber 705 (e.g., fluid 210 as discussed herein). In some embodiments, heating element 706 may heat the entirety of fluid within chamber 705. In some embodiments, heating element 706 may provide local heating for various regions of fluid within chamber 705 as discussed with respect to process 400. Heating element 706 may include any suitable heating element or elements such as heat lamps or the like. For example, heating element 706 may include a plurality of individually controllable heating elements. In the illustrated embodiment, heating element 706 is at a bottom of chamber 705. However, heating element may surround chamber 705 or be provided at any portion of chamber 705. In addition or in the alternative, one or both of wafer holders 203, 205 and/or wafer deformer 209 may include heating elements to heat the fluid within chamber 705.

As shown, one or more of valve 701, pressure gauge 702, motor and pump 709, valve 713, heating element 706, wafer holders 203, 205, and wafer deformer 209 are communicatively coupled to controller 707 such that controller 707 may receive information from such devices and/or control such devices via control signals to perform the operations discussed herein. For example, controller 707 may provide control signals to valve 701 to provide any gaseous fluid discussed herein at any pressure discussed herein. In addition or in the alternative, controller 707 may provide control signals to valve 713 to provide any pressure discussed herein. Controller 707 may provide control signals to heating element 706 (and/or heating elements of one or both of wafer holders 203, 205 and/or heating elements of wafer deformer 209) to heat any fluid discussed herein to any temperature discussed herein and having any local temperature variations as discussed herein. Controller 707 may provide control signals to wafer deformer 209 to initiate bonding between wafers as discussed herein. Controller 707 may provide control signals to motor and pump 709 to dispense any liquid fluid having any characteristics as discussed herein. Controller 707 may provide control signals to one or both of wafer holders 203, 205 to bring wafers being processed within close proximity as discussed herein and/or to release processed (i.e., bonded) wafers.

Figure 8:
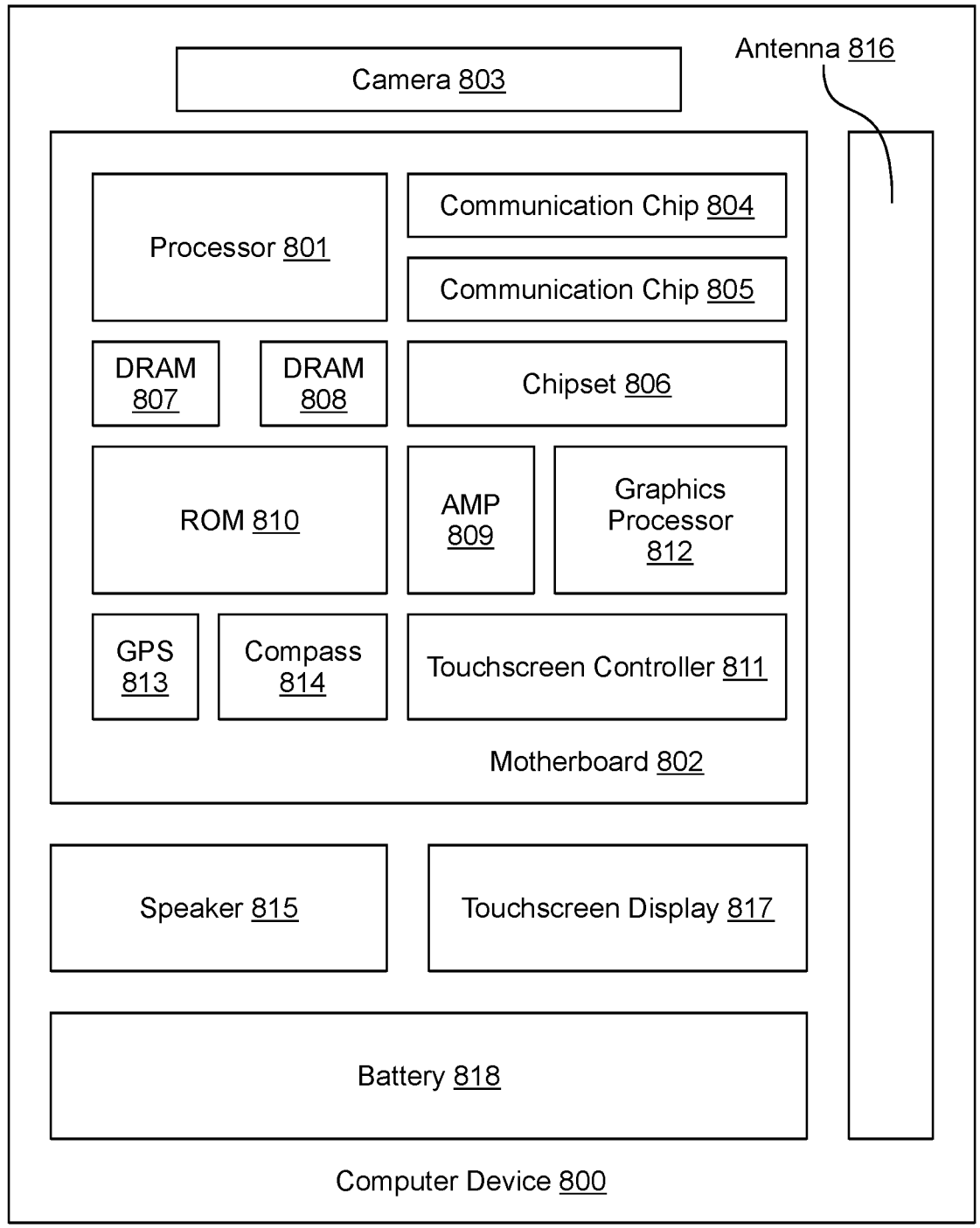
FIG. 8 is a functional block diagram illustrating elements of a computing device for controlling processing to bonding two wafers according to an embodiment.

FIG. 8 is a functional block diagram of a computing device 800, arranged in accordance with at least some implementations of the present disclosure.

As discussed, computing device 800 or portions thereof may be implemented as controller 707. In some embodiments, computing device 800 or portions thereof may be implemented via a mobile computing platform. As shown, computing device 800 includes a motherboard 802 hosting a number of components, such as, but not limited to, a processor 801 (e.g., an applications processor, a microprocessor, etc.) and one or more communications chips 804, 805. Processor 801 may be physically and/or electrically coupled to motherboard 802. In some examples, processor 801 includes an integrated circuit die packaged within the processor 801. In general, the term "processor" may refer to any device or portion of a device that processes electronic data from registers and/or memory to transform that electronic data into other electronic data that may be stored in registers and/or memory.

In various examples, one or more communication chips 804, 805 may also be physically and/or electrically coupled to the motherboard 802. In further implementations, communication chips 804 may be part of processor 801. Depending on its applications, computing device 800 may include other components that may or may not be physically and electrically coupled to motherboard 802. These other components may include, but are not limited to, volatile memory (e.g., DRAM) 807, 808, non-volatile memory (e.g., ROM) 810, a graphics processor 812, flash memory, global positioning system (GPS) device 813, compass 814, a chipset 806, an antenna 816, a power amplifier 809, a touchscreen controller 811, a touchscreen display 817, a speaker 815, a camera 803, and a battery 818, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. For example, touchscreen display 817 may implement any emissive display device structure(s) discussed herein.

Communication chips 804, 805 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 804, 805 may implement any of a number of wireless standards or protocols, including but not limited to those described elsewhere herein. As discussed, computing device 800 may include a plurality of communication chips 804, 805. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. For example, one or both of communication chips 804, 805 may provide a wireless transceiver for computing device 800. As discussed, touchscreen display 817 of computing device 800 may include or utilize one or more emissive display device structures discussed herein.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Figure 9:
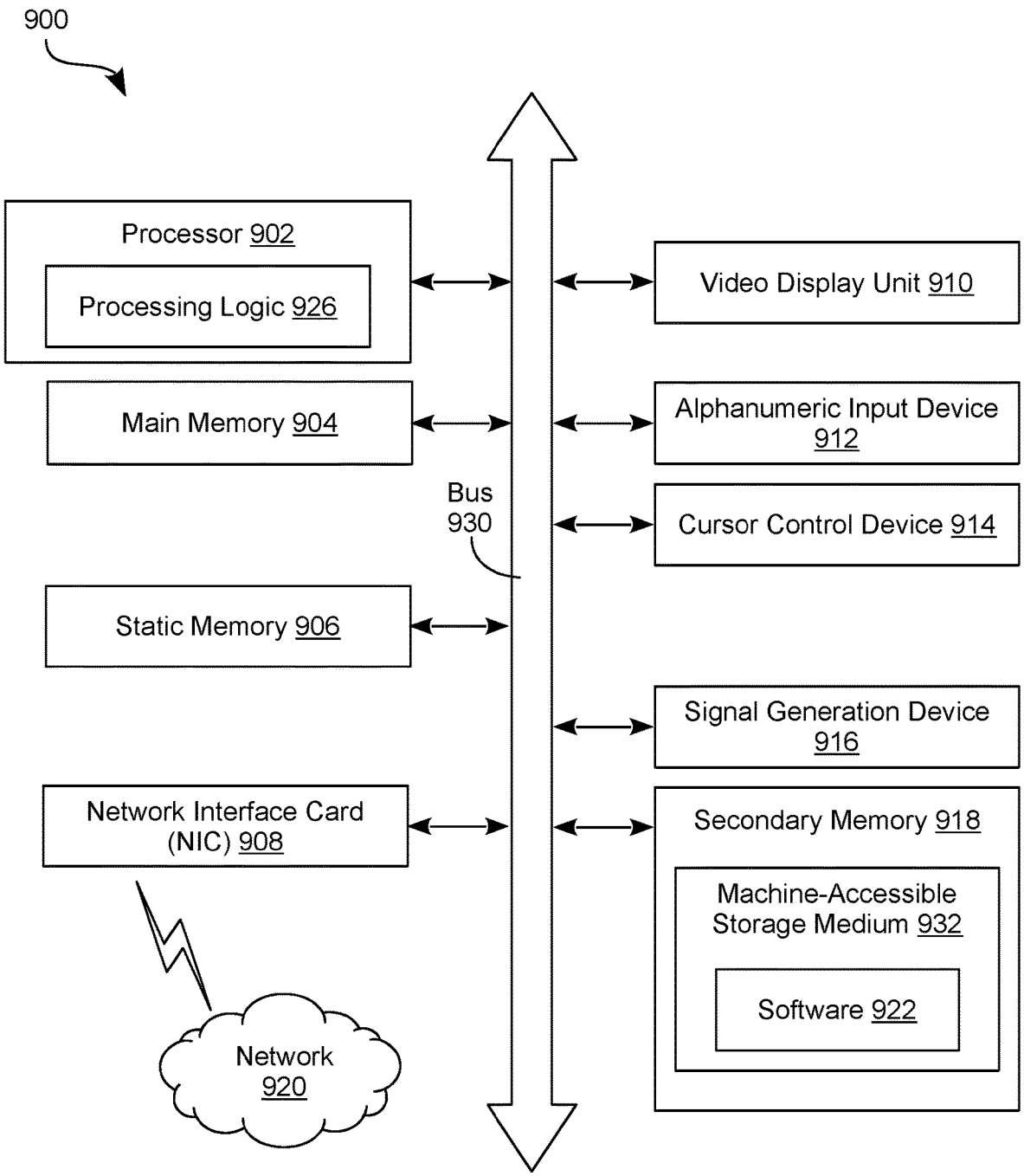
FIG. 9 is a functional block diagram illustrating an exemplary computer system, in accordance with one embodiment.

FIG. 9 illustrates a diagrammatic representation of a machine in the exemplary form of a computer system 900 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 932 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

While the machine-accessible storage medium 932 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

The following examples pertain to further embodiments.

In one or more first embodiments, a method for bonding wafers comprises bringing a first surface of a first wafer within close proximity of a second surface of a second wafer, providing a fluid between the first surface and the second surface, wherein the fluid has a viscosity greater than a viscosity of air at standard ambient temperature and pressure, contacting a first region of the first surface to a second region of the second surface to form a bond therebetween, and propagating the bond to bond the first surface to the second surface.

In one or more second embodiments, for any of the first embodiments, the fluid comprises air at not less than 2 atm.

In one or more third embodiments, for any of the first or second embodiments, the fluid comprises not less than 99% argon at not less than standard ambient temperature (25° C.) and not less than standard ambient pressure (1 atm).

In one or more fourth embodiments, for any of the first through third embodiments, the fluid comprises not less than 99% neon at not less than standard ambient temperature and not less than standard ambient pressure.

In one or more fifth embodiments, for any of the first through fourth embodiments, providing the fluid between the first surface and the second surface comprises providing the fluid at a first temperature and first pressure, and wherein the method further comprises raising the pressure of the fluid to a second pressure during the propagation of the bond.

In one or more sixth embodiments, for any of the first through fifth embodiments, providing the fluid between the first surface and the second surface comprises providing the fluid at a first temperature and first pressure, and wherein the method further comprises raising the pressure of the fluid to a second pressure during the propagation of the bond such that the second pressure is not less than twice the first pressure.

In one or more seventh embodiments, for any of the first through sixth embodiments, the fluid comprises a liquid at standard ambient temperature and pressure.

In one or more eighth embodiments, for any of the first through seventh embodiments, providing the fluid between the first surface and the second surface comprises providing the fluid on the first surface and between an entirety of the first surface and the second surface.

In one or more ninth embodiments, for any of the first through eighth embodiments, providing the fluid between the first surface and the second surface comprises providing a liquid fluid on the first surface and only between a first portion of the first surface around a center of the first wafer and a second portion of the second surface around a center of the second wafer and comprising the second region.

In one or more tenth embodiments, for any of the first through ninth embodiments, the fluid comprises one or more of water, isopropyl alcohol, acetone, or ethyl alcohol.

In one or more eleventh embodiments, a system comprises a controller including a computer readable medium, that when implemented by a processor, instruct the system to perform any of the first through tenth embodiments.

In one or more twelfth embodiments, a system comprises a first wafer holder, a second wafer holder, a wafer deformer, a chamber housing both the first wafer holder and the second wafer holder and having a fluid inlet port therein, a valve fluidly coupled to the fluid inlet port, a heating element, and a controller controllably coupled to the valve, the wafer deformer, and the heating element, the controller to provide signals to the valve, the wafer deformer, and the heating element to perform any of the first through tenth embodiments.

In one or more thirteenth embodiments, a system comprises a first wafer holder to hold a first wafer having a first surface, a second wafer holder to hold a second wafer having a second surface such that the second surface is in close proximity of the first surface, a wafer deformer to deform a portion of the first wafer to contact the second wafer, a chamber housing both the first wafer holder and the second wafer holder and having a fluid inlet port therein, a valve fluidly coupled to the fluid inlet port, and a controller controllably coupled to the valve and the wafer deformer, the controller to provide a first signal to the valve to supply a fluid between the first surface and the second surface, wherein the fluid has a viscosity greater than a viscosity of air at standard ambient temperature and pressure, and to provide a second signal to the wafer deformer to deform the first wafer.

In one or more fourteenth embodiments, for any of the thirteenth embodiments, the system further comprises a heating element, such that the controller is controllably coupled to the heating element and the controller is to provide a third signal to the heating element to heat the fluid.

In one or more fifteenth embodiments, for any of the thirteenth or fourteenth embodiments, the wafer holder further comprises a heating element, such that the controller is controllably coupled to the heater and the controller is to provide a third signal to the heater to heat the fluid.

In one or more sixteenth embodiments, for any of the thirteenth through fifteenth embodiments, the wafer deformer further comprises a heating element, such that the controller is controllably coupled to the heating element and the controller is to provide a third signal to the heater to heat the fluid.

In one or more seventeenth embodiments, for any of the thirteenth through sixteenth embodiments, the fluid comprises air at not less than 2 atm.

In one or more eighteenth embodiments, for any of the thirteenth through seventeenth embodiments, the fluid comprises not less than 99% of argon, neon, or xenon at not less than standard ambient temperature (25° C.) and not less than standard ambient pressure (1 atm).

In one or more nineteenth embodiments, for any of the thirteenth through eighteenth embodiments, the controller is to send a third signal to valve to increase pressure of the fluid during bonding of the first and second wafers.

In one or more twentieth embodiments, for any of the thirteenth through nineteenth embodiments, the fluid is at a temperature of not less than 100° C.

In one or more twenty-first embodiments, for any of the thirteenth through twentieth embodiments, the system comprises a dispenses arm and pump to provide a liquid between the first surface and the second surface such that the liquid is on the first surface and only between a first portion of the first surface around a center of the first wafer and a second portion of the second surface around a center of the second wafer and comprising the second region.

What is claimed is:

1. A system for bonding wafers, the system comprising:
    a first wafer holder;
    a second wafer holder;
    a wafer deformer comprising a heating element;
    a chamber housing both the first wafer holder and the second wafer holder and having a fluid inlet port therein;
    a valve fluidly coupled to the fluid inlet port; and
    a controller controllably coupled to the valve, the wafer deformer, and the heating element, the controller to provide signals to the valve, the wafer deformer, and the heating element to perform a method comprising:
        bringing a first surface of a first wafer to within a distance of a second surface of a second wafer, wherein the distance is in a range of 30 microns and 150 microns;
        providing a fluid between the first surface and the second surface, wherein the fluid has a viscosity greater than a viscosity of air at standard ambient temperature and pressure;
        heating the fluid with the heating element;
        contacting a first region of the first surface to a second region of the second surface to form a bond therebetween; and
        propagating the bond to bond the first surface to the second surface.

2. A system for bonding wafers, the system comprising:
    a first wafer holder to hold a first wafer having a first surface;
    a second wafer holder to hold a second wafer having a second surface, wherein the second surface is to be held at a distance from the first surface wherein the distance is to be in a range of 30 microns and 150 microns;
    a wafer deformer to deform a portion of the first wafer to contact the second wafer;
    a chamber housing both the first wafer holder and the second wafer holder and having a fluid inlet port therein;
    a valve fluidly coupled to the fluid inlet port; and
    a controller controllably coupled to the valve and the wafer deformer, the controller to provide a first signal to the valve to supply a fluid between the first surface and the second surface, wherein the fluid has a viscosity greater than a viscosity of air at standard ambient temperature and pressure, and to provide a second signal to the wafer deformer to deform the first wafer;
    wherein the wafer deformer comprises a first heating element, wherein the controller is controllably coupled to the first heating element, and the controller is to provide a third signal to the first heating element to heat the fluid.

3. The system of claim 2, further comprising a second heating element, wherein the controller is controllably coupled to the second heating element and the controller is to provide a fourth signal to the second heating element to heat the fluid.

4. The system of claim 2, wherein the wafer holder further comprises a second heating element, wherein the controller is controllably coupled to the second heating element and the controller is to provide a fourth signal to the second heating element to heat the fluid.

5. The system of claim 2, wherein the fluid comprises air at not less than 2 atmospheres (atm).

6. The system of claim 2, wherein the fluid comprises argon, neon, or xenon at not less than standard ambient temperature (25° C.) and not less than standard ambient pressure (1 atm).

7. The system of claim 2, wherein the controller is to send a fourth signal to the valve to increase pressure of the fluid during bonding of the first and second wafers.

8. The system of claim 2, wherein the fluid is at a temperature of not less than 100° C.

9. The system of claim 2, further comprising a dispense arm and pump to provide a liquid between the first surface and the second surface such that the liquid is on the first surface and only between a first portion of the first surface around a center of the first wafer and a second portion of the second surface around a center of the second wafer and comprising the second region.

* * * * *